United States Patent [19]

Gollinger et al.

[11] Patent Number: 4,477,735
[45] Date of Patent: Oct. 16, 1984

[54] FAST MOS DRIVER STAGE FOR DIGITAL SIGNALS

[75] Inventors: Wolfgang Gollinger, Gundelfingen, Fed. Rep. of Germany; Daniel Mlynek, Wolfgantzen, France

[73] Assignee: ITT Industries, Inc., New York, N.Y.

[21] Appl. No.: 330,749

[22] Filed: Dec. 14, 1981

[30] Foreign Application Priority Data

Dec. 20, 1980 [EP] European Pat. Off. ........ 80108079.7
Sep. 8, 1981 [EP] European Pat. Off. ........ 81107047.3

[51] Int. Cl.³ .................... H03K 3/01; H03K 17/693; H03K 17/04
[52] U.S. Cl. ................................ 307/270; 307/450; 307/453; 307/577
[58] Field of Search ............... 307/480, 481, 450, 270, 307/453, 448, 577, 583

[56] References Cited

U.S. PATENT DOCUMENTS

| | | | |
|---|---|---|---|
| 3,619,670 | 10/1971 | Heimbigner | 307/453 |
| 3,747,064 | 7/1973 | Thompson | 307/453 |
| 3,772,536 | 11/1973 | Grannis et al. | 307/448 |
| 3,995,172 | 11/1976 | Freeman | 307/450 |
| 4,309,630 | 1/1982 | Young, Jr. | 307/450 |
| 4,339,672 | 7/1982 | Sato | 307/577 |

Primary Examiner—Stanley D. Miller
Assistant Examiner—B. P. Davis
Attorney, Agent, or Firm—Donald J. Lenkszus

[57] ABSTRACT

A fast MOS driver circuit for digital signals having a small current consumption and a good signal-to-noise ratio comprises an output inverter, a pre-inverter and of an enhancement-type transistor having its source-drain path connected in parallel to that of the load transistor of the output inverter (IA). The gate of the enhancement-type transistor and the gates of the load transistors of the output and pre-inverters are coupled to the output of the pre-inverter. The W/L-ratio of the enhancement-type transistor is almost the same as that of the switching transistor of the output inverter. The gates of the switching transistors are connected to one another. The load transistors are of the depletion type while the switching transistors are of the enhancement type. An embodiment is disclosed employing the above circuit and an additional pre-inverter circuit arrangement operating on a two-phase ratio technique controlled by a two-phase clock signal to match capacitances greater than that matched by the above circuit.

19 Claims, 10 Drawing Figures

FAST MOS DRIVER STAGE FOR DIGITAL SIGNALS

BACKGROUND OF THE INVENTION

The present invention relates to a fast, monolithic integrated driver circuit for digital signals employing insulated-gate field-effect transistors which is connected between a load capacitance and the output of a stage capable of being loaded only with the comparatively small input capacitance of the driver circuit. To enable realizing the capacitance ratio of the load capacitance to the input capacitance, the driver circuit include inverters which are connected in series in relation to signal flow, with the switching transistors of the inverters having channel widths which, in direction of the signal flow, increase at least partially from stage to stage in accordance with a geometrical progression; such as that disclosed in German Pat. DE No. 1,487,398 B2.

Such types of MOS driver cirucits, of course, have the property of matching, depending on the number of stages, very large capacitance ratios with short switching times, but have the disadvantage that with an increasing number of stages, the total current flowing in the driver circuit is increased by the multiplication factor of the geometrical progression, because in such a series connection of inverters, in relation to signal flow, always approximately half of the inverters are traversed by current which, in the assumed case of a positive logic, corresponds to the lower binary level L at the output of these inverters. In cases where the series connection of inverters is realized by employing two inverters including enhancement transistors, such an arrangement is not sufficiently noise-proof with respect to certain cases of practical application, i.e. its signal-to-noise ratio is insufficient, with this being due to the fact that the signals corresponding to the high binary level H do not come close enough to the supply voltage.

SUMMARY OF THE INVENTION

An object of the present invention is to provide a fast MOS driver current for digital signals overcoming the above-mentioned disadvantages.

Another object of the present invention is to provide a fast MOS driver circuit for digital signals which, for practically occurring capacitance ratios, can do with less total current than the prior art arrangement described hereinabove and which, has a greater signal-to-noise ratio.

A feature of the present invention is the provision of a fast, monolithic integrated driver circuit for digital signals employing insulated-gate field-effect transistors, the driver circuit being connected between a relatively large load capacitance and the output of a preceding stage which can only be loaded by a comparatively small input capacitance of the driver circuit, the driver circuit comprising: an output inverter including a first load transistor connected in series with a first switching transistor connected in parallel to the load capacitance; a pre-inverter including a second load transistor connected in series with a second switching transistor; the second switching transistor having its gate electrode coupled to the preceding stage and the gate electrode of the first switching transistor; and enhancement transistor having its source-drain path connected in parallel to the drain-source path of the first load transistor; the enhancement transistor and the first and second load transistors each having its gate electrode coupled to each other and to the output of the pre-inverter; and the first and second switching transistors having channel widths which increase at least partially from stage to stage in the direction of signal flow according to a first geometrical progression.

BRIEF DESCRIPTION OF THE DRAWING

Above-mentioned and other features and objects of this invention will become more apparent by reference to the following description taken in conjunction with the accompanying drawing, in which.

DESCRIPTION OF THE PREFERRED EMBODIMENTS

Figure 1:
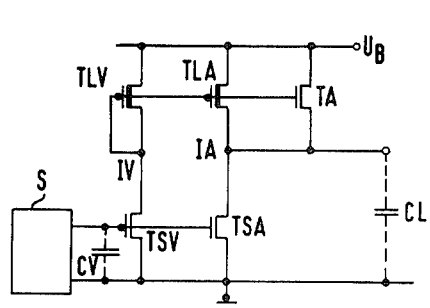
FIG. 1 is a schematic diagram of a first embodiment of a MOS driver circuit in accordance with the principles of the present invention.

FIG. 1 is a schematic diagram of one embodiment of the present invention. The stage S, an output stage of a preceding circuit, is actually supposed to act upon the load capacitance CL indicated by the dash-lines on the righthand side in FIG. 1, as disclosed in German Pat. DE No. 2,623,507 B2. The load capacitance CL, for example, may include the input capacitance of a subsequent stage of the total integrated circuit of which the MOS driver circuit according to the present invention may be a part. Load capacitance CL, however, may also be the capacitance of a further circuit connected from outside to the integrated circuit. Anyhow, the value of the capacitance CL is higher than the capacitance which is still capable of being charged and discharged by the output of the stage S in the case of a fast as possible signal switching. This substantially smaller capacitance corresponds to the input capacitance of the MOS driver circuit of the present invention which, accordingly, is connected between the output of the stage S and the load capacitance CL.

An example of the first embodiment as shown in FIG. 1 includes the output inverter IA having the switching transistor TSA and the load transistor TLA, the pre-inverter IV having the switching transistor TSV and the load transistor TLV, and the enhancement transistor TA whose W/L-ratio (channel-width to channel-length ratio) almost equals that of switching transistor TSA. These transistors are connected to each other as follows. The gates of the two switching transistors TSV and TSA are connected to one another and to the output of the stage S which is capable of acting upon the input capacitance CV of the MOS driver circuit which is substantially composed of the sum of the input capacitances of the two switching transistors TSV and TSA and the associated wiring capacitance. The load transistors TLV and TLA are connected in series as load elements to the two switching transistors TSV and TSA, respectively, and have one end of their source-drain path coupled to the supply voltage $U_B$. The source-drain section of the enhancement transistor TA is connected in parallel with that of the load transistor TLA. The two load transistors TLV and TLA are of the depletion type while the switching transistors TSV and TSA are of the enhancement type. The gates of the load transistors TLV and TLA and of the enhancement transistor TA are connected to the output of the pre-inverter IV.

Figure 4:
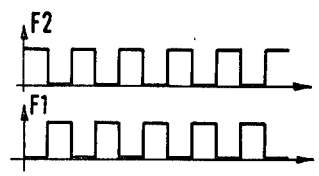
FIG. 4 is a timing diagram of the two-phase clock signals as used in the embodiment of FIG. 2.
Figure 5:
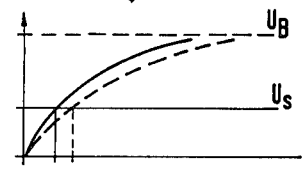
FIG. 5 is a set of curves as a function of time relating to the voltage rise at the output of the driver circuit in accordance with the principles of the present invention.

By providing the enhancement transistor TA in connection with depletion-type transistors and by controlling the gate electrode thereof from the output of the pre-inverter IV, and dimensioning the W/L-ratio, the shape of the voltage rise as a function of time at the output, of the driver circuit of the present invention, and hence, at the load capacitance CL, is not as flat as with the usual inverter indicated by the dashline curve in FIG. 5, but rather is steeper as shown by the solid curve in FIG. 5, which has a substantially greater time scale than FIG. 4.

According to the present invention, especially when subsequently following stages are controlled by a lower threshold voltage Us, for example, during the control of TTL switching stages, there will appear a substantial saving in time because by the continuous curve in FIG. 5 the threshold voltage Us is reached substantially faster than by the curve indicated by the dashlines.

Figure 2:
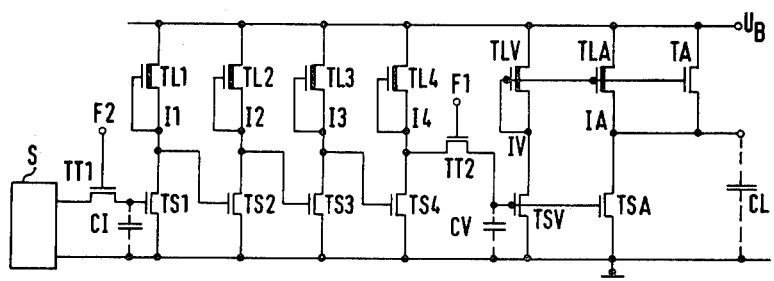
FIG. 2 is a schematic diagram of a second embodiment of a MOS driver circuit in accordance with the principles of the present invention.

The embodiment of the invention of FIG. 1 is suitable for matching capacitance ratios C=CL/CV of approximately 15 to 30. However, if greater capacitance ratios C are to be matched there will have to be employed an embodiment of the invention as illustrated in FIG. 2. Basically in FIG. 2 the capacitance ratio C is divided in such a way into two factors C1 and C2 that one part can be matched by the arrangement according to FIG. 1 while the second part can be matched by correspondingly modifying the principle disclosed in the aforementioned German Pat. DE No. 1,487,398 B2 which will be described hereinbelow.

Referring to FIG. 2, an embodiment utilizing the known two-phase ratio technique, includes between the output of the stage S and the input of the MOS driver circuit with the input capacitance CV, a first transfer transistor TT1 which is controlled by a two-phase clock signal F2. In accordance with the known two-phase ratio technique, the inverters with respect to the W/L-ratio of the switching transistor to the load transistor, are so dimensioned that the switching transistors, at a certain ratio, are less high-ohmic in the turned-on state than the load transistors, so that the potential at zero point of the circuit serving as the lower level L of the two binary levels, is reached as well as possible.

Similar to the first transfer transistor TT1 at the input of the MOS driver circuit, a corresponding second transfer transistor TT2 precedes the input of the circuit part according to FIG. 1 which now serves as the output stage, and which is controlled by the two-phase clock signal F1. The shape of the two-phase clock signals F1 and F2 as a function of time are shown in FIG. 4, and include two non-overlapping squarewave signals phase-shifted by 180°, with a pulse-duration to pulse-interval ratio of approximately 1:1.

Between the two transfer transistors TT1 and TT2, is arranged a series connection of the pre-stage inverters I1, I2, I3 and I4 in relation to the signal flow, and based on the principles of the aforementioned German Pat. DE No. 1,487,398 B2 with the switching transistors TS1, TS2, TS3 and TS4 thereof being of the enhancement type, with the load transistors TL1, TL2, TL3 and TL4 thereof being of the depletion type, and with the gate electrode of each load transistor being connected to the output of the corresponding inverter, so that these depletion-type transistors are connected as nonlinear load resistors. The W/L-ratios of the switching transistors TS1 ... TS4 increase in accordance with a geometrical progression from inverter to inverter I1 ... I4.

Relative thereto, it will generally be such that for the capacitance ratio part C2=CV/CI there is provided a number of inverters which actually permits matching a larger capacitance ratio. This, however, is actually favorable because in that case, the last inverter I4 of the series is loaded less than admissible by the input capacitance CV of the subsequent circuit part, so that the last inverter I4 permits a comparatively faster voltage-rise. This voltage-rise reserve may be used to compensate for the loss in speed caused by the probably somewhat slower subsequent partial circuit. In this way, the current consumption can be reduced by maintaining an unchanged delay time.

As can be seen from FIG. 2, with the aid of the two transfer transistors TT1, TT2, the total delay time of the MOS driver circuit is also divided in such a way that the delay time of the pre-inverters I1 ... I4 is shorter than half the period of the two-phase clock signal, and so that the remaining delay time, so to speak, fits into the other half of the clock signal.

The dimensioning rule for the enhancement transistor TA according to FIGS. 1 and 2, according to which its channel-width to channel-length ratio, hence, its W/L-ratio, is supposed to be almost the same as that of the switching transistor TSA of the output inverter IA. Moreover, with respect to the pre-inverters I1 ... I4 they are dimensioned to the shortest delay time by keeping constant the quotient of both the input capacitance of the inverter subsequently following within the series, and the W/L-ratio of the load transistor of the inverter.

One advantageous further embodiment resides in the W/L-ratio of the load transistor TLA of the output inverter IA being dimensioned in such a way that almost half of the entire current of the driver circuit according to FIG. 2, flows through this inverter.

Figure 3:
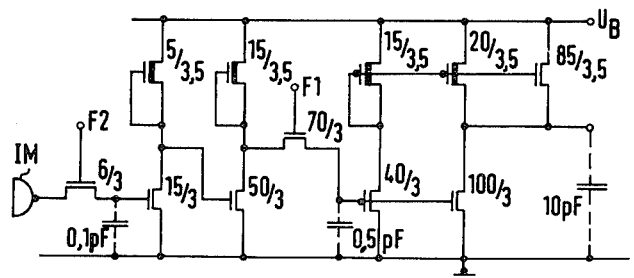
FIG. 3 is a schematic diagram of a MOS driver circuit corresponding to FIG. 2 with dimensioning statements concerning the W/L-ratios (width-to-length ratio of the transistor channel)

FIG. 3 is a circuit diagram substantially identical to FIG. 2 in which instead of the reference numerals, there are given the corresponding W/L-ratios as well as the capacitance values capable of being matched. As is evident, there are merely provided two pre-inverters which, via the first transfer transistor, are controlled by the inverter IM which is a minimum size inverter. The latter can only operate in response to a capacitance of 0.1 pF, (picofarad) with this corresponding to the input capacitance of the driver circuit according to FIG. 3. The input capacitance of the output stage according to FIG. 3 amounts to 0.5 pF and the load capacitance at the output thereof amounts to 10 pF. The capacitance ratio C, accordingly, amounts to 100 and is divided into the two parts or factors 20 (output stage) and 5 (prestage). With the two pre-inverters as shown, however, it is possible to match a capacitance ratio of approximately 10 so that, as already described hereinabove, there exists a delay time reserve with respect to the output stage, because the input capacitance thereof only amounts to 0.5 pF.

From the indicated W/L-ratios in FIG. 3 it can be seen that the dimensioning rules given therefor in the foregoing, have been adhered to. For example, the W/L-ratios of the switching transistor, are almost alike, as are the W/L-ratios of the load transistor of the output inverter and of the load transistors of the pre-inverters.

Finally, it is also shown in FIG. 3 that the W/L-ratios of the transfer transistors TT1 and TT2 are dimensioned in accordance with the capacitance ratio part capable of being matched with the pre-inverters.

In FIGS. 1 to 3 and FIGS. 6 to 10 all transistors are of the same conductivity type, either p-channel or n-channel transistors. In referring to FIG. 6 there is shown a third embodiment of the MOS driver circuit which is a modification of FIG. 1. The embodiment of FIG. 6 enables a further improvement with regard to the power consumption by maintaining the same dynamic behavior. The modification of FIG. 1 includes an intermediate inverter IZ inserted between the pre-inverter IV and the output inverter IA with the gate electrodes of the switching transistor TSZ being connected to the gate electrodes of the switching transistors TSV and TSA while the gate electrodes of the load transistor TLZ of the intermediate inverter IZ being connected to the output of the pre-inverter IV, and the gates of both the enhancement transistor TA and the load transistor TLA of the output inverter IA being connected to the output of the intermediate inverter IZ. The intermediate inverter IZ is a depletion-load type of inverter, i.e. its load transistor TLZ is of the depletion type and its switching transistor TSZ is of the enhancement type. The channel width of the switching transistor TSZ is larger by about the multiplication factor of the geometrical progression than that of the switching transistor TSV of the pre-inverter IV. By the aforementioned insertion of the intermediate inverter IZ the load circuit of the output inverter IA, unlike in the arrangement according to FIG. 1, is operated dynamically.

Figure 7:
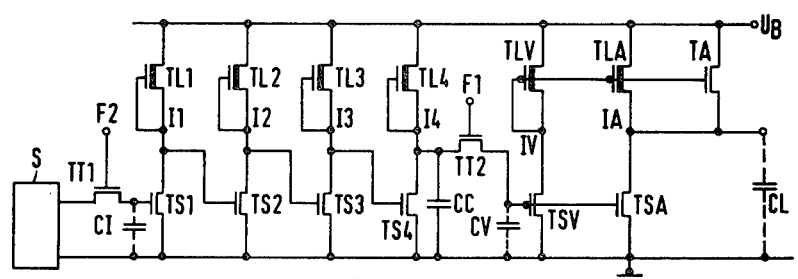
FIG. 7 is a schematic diagram of a fourth embodiment of a MOS driver circuit in accordance with the principles of the present invention which is a modification of the circuit of FIG. 2.

FIG. 7 shows a modification of FIG. 2, which likewise leads to a reduction of the power loss by maintaining the same switching speed. The modification of FIG. 2 includes a capacitor CC coupled between the input of the second transfer transistor TT2, and the zero point or ground of the circuit.

Figure 8:
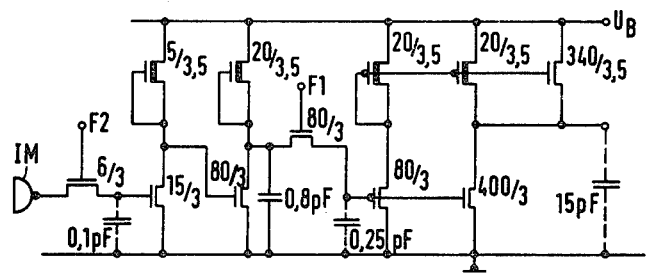
FIG. 8 is a schematic diagram of a MOS driver circuit corresponding to FIG. 7; with dimensioning statements concerning the W/L-ratio (width-to-length ratio of the transistor channels)

FIG. 8 shows an example of embodiment of FIG. 7, which is comparable with FIG. 3, and is dimensioned with respect to the W/L-ratios. This example is for matching a capacitance ratio C=150. The employed capacitor CC has a capacitance value of 0.8 pF. This example of the embodiment of FIG. 7 has a power loss of 20 mW at a frequency of 17 MHz of the two-phase clock signal. Owing to the capacitance ratio C which is greater than that of FIG. 3, the W/L-ratios as compared to FIG. 3 are only slightly changed except with respect to the output inverter. Of course, the greater capacitance ratio C requires the W/L-ratio of the switching transistor TSA of the output ihverter IA and, consequently, also of the enhancement transistor TA to be dimensioned correspondingly larger from 100/3 or 85/3.5 in FIG. 3 to 400/3 or 340/3.5 in FIG. 8, respectively.

Figure 6:
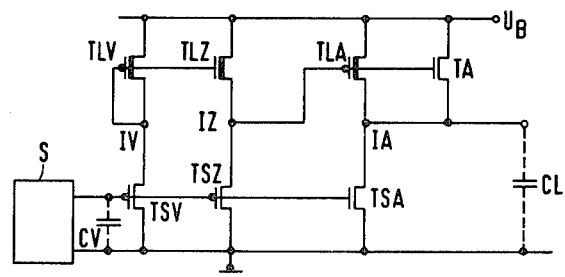
FIG. 6 is a schematic diagram of a third embodiment of a MOS driver circuit in accordance with the principles of the present invention which is a modification of the circuit of FIG. 1.
Figure 9:
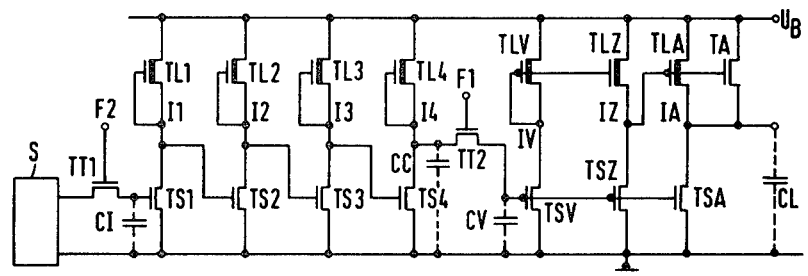
FIG. 9 is a schematic diagram of a fifth embodiment of a MOS driver circuit in accordance with the principles of the present invention which is a combination of the embodiments of FIGS. 2 and 6.

FIG. 9 shows the combination of FIG. 2 with the output stage of FIG. 6. Moreover, as indicated by the dashlined capacitor CC the arrangement as shown in FIG. 9 can be operated without or with this capacitor CC.

Figure 10:
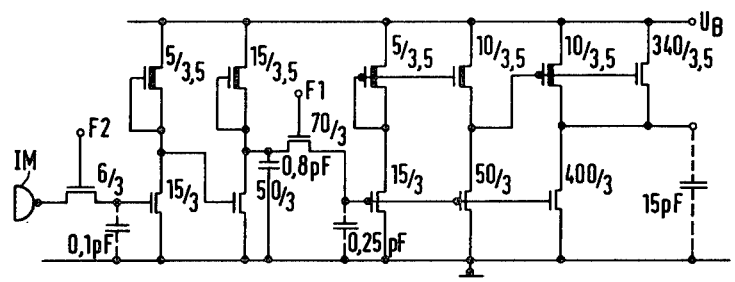
FIG. 10 is a schematic diagram of a MOS driver circuit with dimensioning statements concerning the W/L-ratio (width-to-length ratio of the transistor channels).

Finally, FIG. 10 shows an example of the embodiment of FIG. 9, which is comparable with FIGS. 3 and 8, and is dimensioned with respect to the W/L-ratios. Compared with the example of the embodiment of FIG. 8 and thanks to the two additional measures, namely, using the output stage according to FIG. 6 and the capacitor CC according to FIG. 7, there is only a power loss of 15 mW at the unchanged two-phase clock-signal frequency of 17 MHz.

While we have described above the principles of our invention in connection with specific apparatus it is to be clearly understood that this description is made only by way of example and not as a limitation to the scope of our invention as set forth in the objects thereof and in the accompanying claims.

We claim:

1. A fast, monolithic integrated driver circuit for digital signals employing insulated-gate field-effect transistors, said driver circuit being connected between a relatively large load capacitance and the output of a preceding stage which can only be loaded by a comparatively small input capacitance of said drive circuit, said drive circuit comprises:

an output inverter including a first load transistor connected in series with a first switching transistor connected in parallel to said load capacitance;

a pre-inverter including a second load transistor connected in series with a second switching transistor; said second switching transistor having its gate electrode coupled to the gate electrode of said first switching transistor;

an enhancement transistor having its source-drain path connected in parallel to the drain-source path of said first load transistor;

said enhancement transistor and said first and second load transistors each having its gate electrode coupled to each other and to the output of said pre-inverter;

said output inverter and said pre-inverter providing a first part of a total capacitance ratio of said load capacitance to said input capacitance and the remaining part of said total capacitance ratio being provided by a plurality of prestage inverters connected in series relative to signal flow between said gate electrode of said second switching transistor and said preceding stage, each of said plurality of prestage inverters comprising a load transistor connected in series with a switching transistor and being dimensioned to provide the shortest delay time by keeping the quotient of the input capacitance of the next following one of said plurality or prestage inverters in said series and said width-length ratio of the switching transistor the next following one of said plurality of prestage inverters constant, said channel width of each of said plurality of prestage inverters increasing at least partially from stage to stage in the direction of signal flow according to a second geometrical progression.

2. A driver circuit according to claim 1, wherein said enhancement transistor has a channel-width to channel-length ratio approximately equal to that of said first switching transistor.

3. A driver circuit according to claim 2, wherein said first and second load transistors are depletion type transistors and said first and second switching transistors are enchancement type transistors.

4. A driver circuit according to claim 1, wherein said first and second load transistors are depletion type transistors and said first and second switching transistors are enhancement type transistors.

5. A driver circuit according to claim 1, further including
a first transfer transistor coupled between said preceding stage and the first of said plurality of prestage inverters controlled by one of a two-phase clock signal; and
a second transfer transistor coupled between the last of said plurality of prestage inverters and the gate of said second switching transistor controlled by the other of said two-phase clock signal.

6. A driver circuit according to claim 5, wherein each of said plurality of prestage inverters include a depletion type load transistor coupled in series with an enhancement type switching transistor.

7. A driver circuit according to claim 6, wherein said first load transistor has a channel-width to channel-length ratio such that approximately one half of the total current consumption of said driver circuit flows therein.

8. A driver circuit according to claim 1, 2, 3 or 4 wherein each said load transistor is a depletion type and each said switching transistor is an enhancement type.

9. A driver circuit according to claim 8, wherein said first load transistor has a channel-width to channel-length ratio such that approximately one half of the total current consumption of said driver circuit flows therein.

10. A driver circuit according to claim 5, wherein said first load transistor has a channel-width to channel-length ratio such that approximately one half of the total current consumption of said driver circuit flows therein.

11. A driver circuit according to claim 1, wherein said first load transistor has a channel-width to channel-length ratio such that approximately one half of the total current consumption of said driver circuit flows therein.

12. A driver circuit according to claims 2, 3 or 4, wherein said first load transistor has a channel-width to channel-length ratio such that approximately one half of the total current consumption of said driver circuit flows therein.

13. A driver circuit according to claim 1, further including
an intermediate inverter coupled between said pre-inverter and said output inverter, said intermediate inverter having an enhancement-type switching transistor whose gate electrode is coupled to said gate electrode of said first and second switching transistors and a depletion-type load transistor whose gate electrode is coupled to said output of said pre-inverter, said gate electrode of both said enhancement transistor and said first load transistor being connected to the output of said intermediate inverter.

14. A driver circuit according to claim 13, wherein said enhancement type switching transistor of said intermediate inverter has a channel width which is larger than the channel width of said second switching transistor by a multiplication factor approximately equal to said first geometrical progression.

15. A driver circuit according to claim 14, further including
a first transfer transistor coupled between said preceding stage and the first of said plurality of prestage inverters controlled by one of a two-phase clock signal; and
a second transfer transistor coupled between the last of said plurality of prestage inverters and the gate of said second switching transistor controlled by the other of said two-phase clock signal.

16. A driver circuit according to claim 15, further including
a capacitor coupled between the input of said second transfer transistor and ground.

17. A driver circuit according to claim 13, further including
a first transfer transistor coupled between said preceding stage and the first of said plurality of prestage inverters controlled by one of a two-phase clock signal; and
a second transfer transistor coupled between the last of said plurality of prestage inverters and the gate of said second switching transistor controlled by the other of said two-phase clock signal.

18. A driver circuit according to claim 17, further including
a capacitor coupled between the input of said second transfer transistor and ground.

19. A driver circuit according to claim 5, further including
a capacitor coupled between the input of said second transfer transistor and ground.

* * * * *